United States Patent [19]

Samarov et al.

[11] Patent Number: 4,959,752

[45] Date of Patent: Sep. 25, 1990

[54] ELECTRONIC MODULE RFI/EMI SHIELDING

[75] Inventors: Victor M. Samarov, Carlisle; George A. Doumani, Jr., North Andover, both of Mass.; Philip F. Becker, Bedford, N.H.

[73] Assignee: Digital Equipment Corporation, Maynard, Mass.

[21] Appl. No.: 262,436

[22] Filed: Oct. 24, 1988

[51] Int. Cl.$^5$ .............................................. H05K 9/00
[52] U.S. Cl. .............................. 361/424; 174/35 GC; 427/96
[58] Field of Search ............................. 361/424, 395; 174/35 CG; 427/96, 98

[56] References Cited

U.S. PATENT DOCUMENTS

| | | | |
|---|---|---|---|
| 3,179,854 | 4/1965 | Luedicke et al. | 361/395 |
| 4,830,922 | 5/1989 | Sparrowhawk et al. | 427/96 |

FOREIGN PATENT DOCUMENTS 1213726  11/1970  United Kingdom ................. 361/424

*Primary Examiner*—Roy N. Envall, Jr.
*Attorney, Agent, or Firm*—Hayes, Soloway, Hennessey & Hage

[57] ABSTRACT

A system, i.e. method and materials for RFI/EMI shielding an electronic module in a computer or other electronic product is described. In one embodiment of the invention predetermined areas of the module, such as connectors, mounting holes, and electrically insulated portions of the cases of high heat-dissipation electronic devices of the module, are masked. Thereafter, a relatively tichk, substantially continuous, electrically insulating conformal coating, in liquid state, is applied to all exposed surfaces of the module by a suitable technique, such as dipping or spraying. The preferred coating is a polymer-resin coating of a predetermined high viscosity and may be applied unfilled or filled with an electrically-insulating, thermally-conductive solid, such as powdered metal oxide, e.g. aluminum oxide. The applied conformal coating is set or cured, and a substantially continuous electrically conductive coating is applied over the insulating coating by a suitable technique, such as spraying or plating. The conductive coating has an electrical resistivity adequate for the required level of suppression of the RFI/EMI emissions from the module. Finally, the masking is removed from the masked areas of the module. In another embodiment of the invention, the electrically insulating coating is applied as a film which is vacuum formed in place, or the film may be pre-formed to conform with the module being shielded. The electrically conductive coating is then applied as above described.

25 Claims, 4 Drawing Sheets

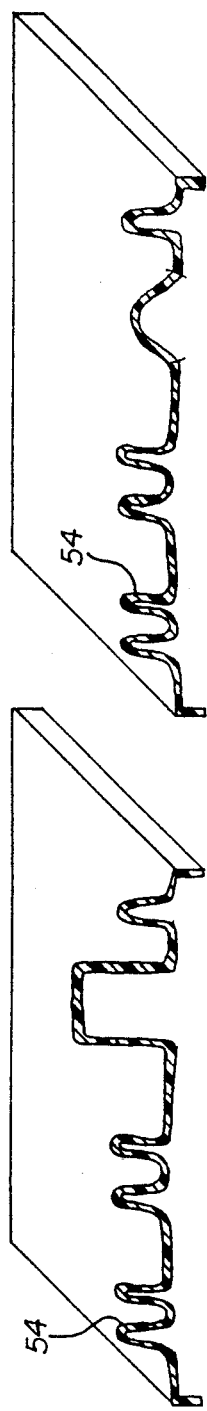
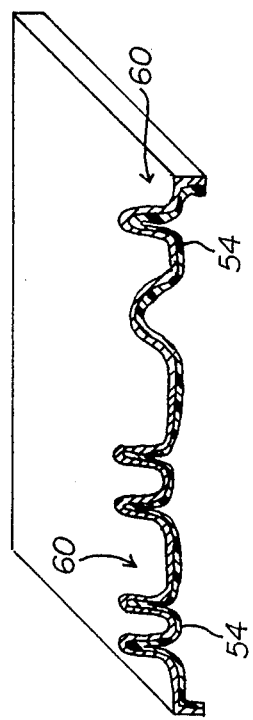
FIG. 11
FIG. 12
FIG. 13

ELECTRONIC MODULE RFI/EMI SHIELDING

BACKGROUND OF THE INVENTION

The present invention relates to shielding electronic assemblies, and, more particularly, to a system for RFI/EMI-shielding individual modules of electronic assemblies. The invention has particular application and advantage when used in connection with RFI/EMI shielding of non-repairable, disposable electronic modules and will be described in connection with such use although other uses are contemplated.

It is a common approach in the shielding of electronic assemblies, in order to limit radio frequency interference (RFI) and electromagnetic interference (EMI) created by them or to protect them from RFI/EMI interference, to enclose the parts within a substantially continuous, electrically conductive shell, such as a sheet metal chassis or a conductive film-coated plastic enclosure. Thus, as shown in FIGS. 1-3, an electronics assembly 10 having a plurality of modules 12 therein (wherein perhaps only one module emits RF and/or EM radiation) is entirely housed in a metal shielding enclosure 14 as depicted in FIG. 2 or in a plastic enclosure 16 having a shielding coating 18 on the surface thereof as depicted in FIG. 3.

The disadvantages of the approach of FIG. 2 are mainly complexity and high cost, since a complete chassis-shell, with multiple electrical and mechanical connections along its joints, must be provided inside a mostly appearance/human interface-oriented outer plastic enclosure (not shown). Among the disadvantages of the approach of FIG. 3 is difficulty in cost-effectively providing reliable electrical continuity across plastic enclosure joints. Any discontinuities in those joints, forming over time due to, e.g. plastic warpage, may result in an unacceptable drop in shielding efficiency.

SUMMARY OF THE INVENTION

The present invention provides a system, i.e. a method and materials for RFI/EMI shielding individual modules of an electronic assembly. More particularly, in accordance with the present invention a substantially continuous, conformal, electrically insulating coating material is applied to the surfaces of the module to a thickness to reliably cover sharp protruding features of the electronic components on the module, in particular those features carrying electrical signals. Thereafter, a substantially continuous, electrically conductive coating material is applied over the insulating coating material.

In one embodiment of the invention, the substantially continuous, conformal, electrically insulating coating material is applied in liquid state either in a single coating step, or by a series of coating steps, to one or both sides of the module, and hardened, cured or set in place to build up a thickness sufficient to electrically isolate electrically conductive surfaces of the module from the electrically conductive coating material, but not so thick as to significantly interfere with heat dissipation from the module. Typically the electrically insulating coating may be applied to a thickness of 0.005 inch to 0.060 inch, preferably, 0.010 inch to 0.020 inch. The coating material preferably comprises a liquid material of sufficiently high viscosity such that small spaces are reliably bridged by the hardened, set or cured material and respective fillets/meniscuses are formed in corners by the hardened, set or cured material. Also, if desired, the electrically insulating coating material may be filled with an electrically-insulating, thermally-conductive powdered solid, such as a metal oxide, for example, aluminum oxide, in order to promote heat transfer from the components of the module. In another embodiment of the invention, the substantially continuous, conformal, electrically insulating coating material may be applied in sheet form. In such embodiment, the sheet, which typically comprises a thin (e.g. 0.005 to 0.060 inch thick) sheet of thermoplastic material, is positioned over the module, the sheet is drawn down by a vacuum to conform with the module surface, and the sheet is then heat sealed onto the module, for example, according to the process disclosed in Moran U.S. Pat. No. 3,568,295 on Johnston U.S. Pat. No. 3,388,465. Alternatively, the sheet may be preformed or molded, e.g. using vacuum molding techniques to conform with the surface topography of the module to be protected.

DESCRIPTION OF THE DRAWINGS

For a fuller understanding of the nature and objects of the present invention, reference should be had to the following detailed description taken in connection with the accompanying drawings wherein like numerals denote like elements, and:

FIG. 11 is a simplified perspective drawing of the electronics module of FIG. 5 at an intermediate stage in the process of FIG. 10 of the present invention;

FIG. 12 is a partially cutaway drawing of the electronics module of FIG. 5 at a further intermediate stage in the process of FIG. 10 of the present invention;

FIG. 13 is a partially cutaway drawing of the electronics module of FIG. 5 at a yet further intermediate stage in the process of 10 of the present invention; and, FIG. 14 is a simplified perspective drawing of an EMI/RFI shielded electronics module made in accordance with the present invention.

DESCRIPTION OF THE PREFERRED EMBODIMENT OF THE INVENTION

Figure 3:
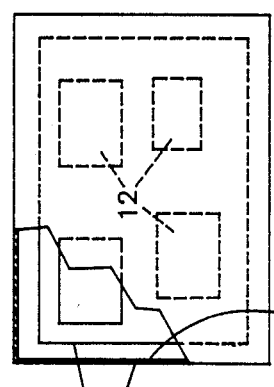
FIG. 3 is a simplified drawing showing the electronics assembly of FIG. 1 housed in a plastic EMI/RFI shielding enclosure 16-18 according to the prior art.
Figure 2:
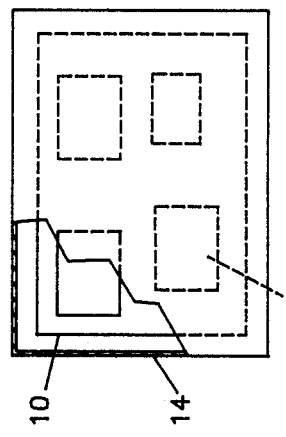
FIG. 2 is a simplified drawing showing the electronics assembly of FIG. 1 housed in a metal EMI/RFI shielding enclosure 14 according to the prior art.
Figure 1:
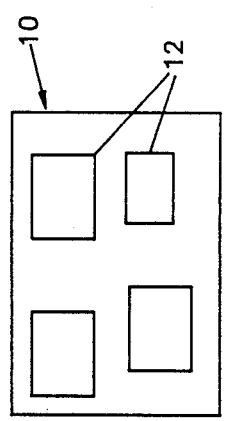
FIG. 1 is a simplified drawing showing an electronics assembly comprised of multiple modules 12 mounted on a support or base 10.
Figure 5:
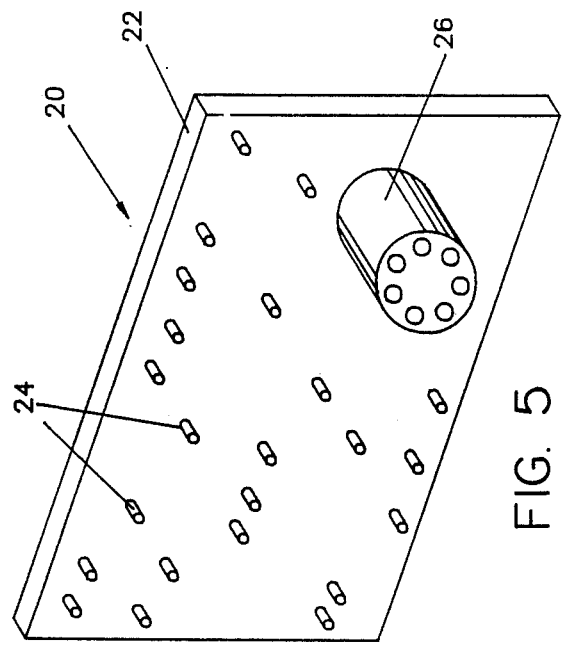
FIG. 5 is a simplified perspective drawing of an electronics module as wherein the present invention is applied.
Figure 4:
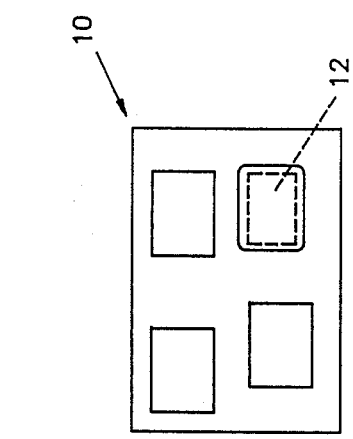
FIG. 4 is a simplified drawing showing the electronics assembly of FIG. 1 with individual modules 12 EMI/RFI shielded according to the present invention.

To overcome the drawbacks of the prior art, the present invention shifts the task of EMI/RFI shielding to the electronic module level. A typical module 20 to be employed in conjunction with the description which follows is shown in simplified form in FIG. 5. The module 20 comprises a printed circuit board 22 as is known in the art having components mounted thereon. In particular, there are components 23 having projecting lead ends 24 and/or larger components such as the projecting connector 26 which must be accounted for. Further, it is necessary that the method provide an effective electroconductive EMI/RFI shield around a non-repairable, disposable module such as 20 without shorting the module's exposed signal-carrying parts or substantially impairing its operating parameters, such as speed, due to the close capacitive proximity of continuous conductive shielding planes to its signal-carrying parts.

Figure 6:
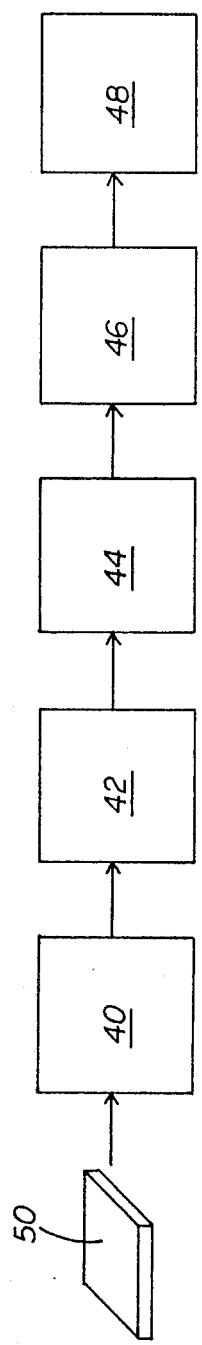
FIG. 6 is a side elevational view, diagrammatically illustrating one process for producing an EMI/RFI shielded electronics module in accordance with one embodiment of the invention.
Figure 7:
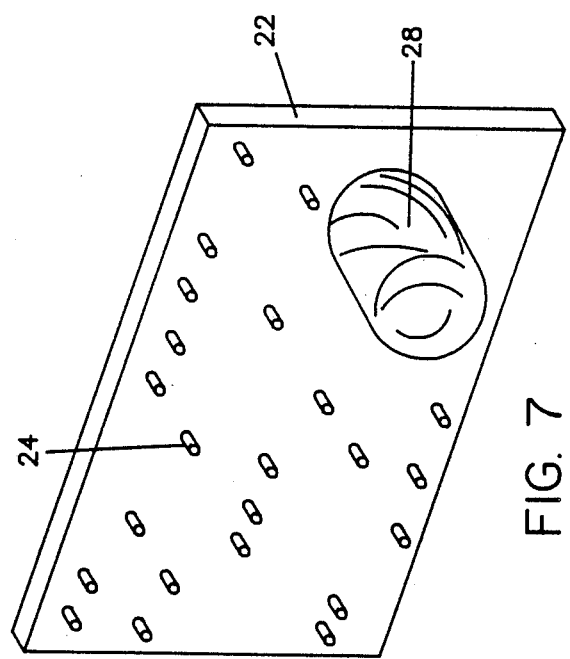
FIG. 7 is a simplified perspective drawing of the electronics module of FIG. 5 at an intermediate stage in the process of FIG. 6 of the present invention.

One method of the present invention for accomplishing these goals and requirements is depicted in FIG. 6. The first step of the method according to this invention is shown in FIG. 6 and comprises masking predetermined areas of the module 20, such as connector 26 (see FIGS. 6 and 7), mounting holes, and electrically insulated portions of the cases of high heat-dissipation electronic devices of the module 20 at a masking station 40. The masking can be achieved by any conventional means, from manually-applied pre-cut masking tape 28 for small volume runs, to custom-made, snap-on cover elements, to mechanized, permanent tooling-like sets of masks for mass production. The purpose of keeping electrically insulated portions of high-dissipation device cases free of coating is to maintain their cooling regime mostly unchanged. Without masking, subsequent coating layers might affect the reliability of some of the thermally-marginal devices.

Figure 8:
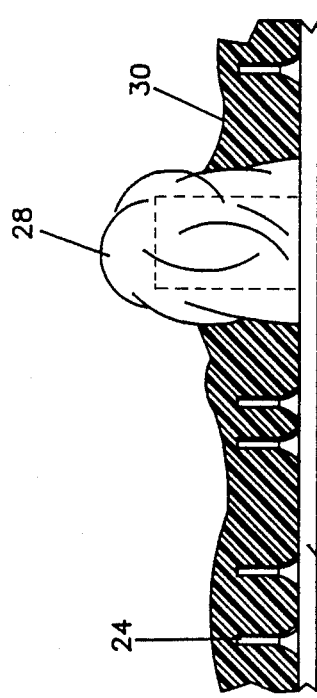
FIG. 8 is a partially cutaway drawing of the electronics module of FIG. 5 at a further intermediate stage in the process of FIG. 6 of the present invention.

The second step is shown in FIG. 8 and comprises the application, at an insulation coating station 42, of a substantially continuous conformal, electrically insulating coating material 30 to all exposed surfaces of the module. The electrically insulating coating material should be applied to form a layer of sufficient thickness to adequately space the continuous conductive shielding planes as will be described in detail hereafter from the module circuits to negate the capacitive effects on the latter. While there are large number of materials which may be used as the electrically insulating coating material in accordance with the present invention, the preferred materials comprise thermoplastic materials which remain solid, and are thermally stable at the expected operating temperatures of the modules. Among suitable materials are mentioned various synthetic polymer-resins including acrylic resins, polyurethane resins, epoxy resins, silicone resins, polyimides and diallyl phthalates, all of which are commercially available and in use in the electronics industry as conformal coatings for providing environmental protection to electronic assemblies. Further details of conformal coatings are discussed in detail in Chapter 20 of "Printed Circuits Handbook" edited by Clyde F. Coombs, J. F. McGraw Hill Book Co. (3rd Ed. 1988), which is incorporated by reference. Particularly preferred synthetic polymer-resin useful as the electrically insulating coating material in accordance with the present invention comprise block copolymers of polycarbonate and silicone rubber of the type described in U.S. Pat. Nos. 3,189,662 and 3,832,419. One such material is available from General Electric Company under the trade name L.R. 3320 Resin.

Coating material 30 can be applied, for example, by dipping the whole module in, or by spraying it with the polymer-resin coating. Coating material 30 may be applied in a single coating step, or by a series of coating steps to achieve a desired thickness, typically 0.005 inch to 0.060 inch, preferably, 0.010 inch to 0.020 inch, and may be applied, unfilled, or the coating material may be filled with an electrically-insulating, thermally conductive solid, such as a powdered metal oxide, e.g. aluminum oxide, in order to promote heat transfer from the components of the module. The powdered aluminum oxide filler material may comprise one or a mixture of two types. The first type consists of elemental (so-called atomized) aluminum (metal) powder. Atomized aluminum metal powder is available commercially from a number of sources and is produced by high pressure jet ejection of high grade molten aluminum into hot air or steam. The presently preferred atomized aluminum metal powder is Aluminum 101 powder available from Alcoa Company, Pittsburgh, Pa. The manufacturer describes this product as comprising steam ejected aluminum metal particles of about 99.7% purity, and having a generally spherical particle shape and an average particle diameter of 17 to 24 microns. The particles are contained within a protective coating of aluminum oxide ($Al_2O_3$) of approximately 50°A thickness which results from the atomization process.

A second type of powdered aluminum oxide useful in accordance with the present invention consists of high purity anhydrous aluminum oxide $Al_2O_3$ (alumina). High purity aluminum oxide is available commercially from a variety of sources. The aluminum oxide can be partially or wholly dehydrated, e.g. by heating the oxide to appropriate temperature in a manner well known in the art.

Coating material 30 should have an inherent viscosity or its viscosity adjusted such that small spaces, e.g. between electronic devices, pins, leads, and the like, are reliably covered or bridged by the coating material, and respective fillets/meniscuses are formed in the corners by the coating material. A critical requirement of the insulating coating material 30 is that it reliably covers sharp protruding features of the electronic components on the module, in particular, those features carrying electrical signals. Typical examples of such signal-carrying features are device lead ends 24, pins, and respective solder icicles on the solder side of the module.

The next step of the method according to this invention comprises the setting or curing of the insulating coating material 30 applied to the module at a curing station 44. The curing environment, regime and duration will depend on the chemical nature of the insulating material employed, and will be accomplished by conventional, prior art means and processes.

Figure 9:
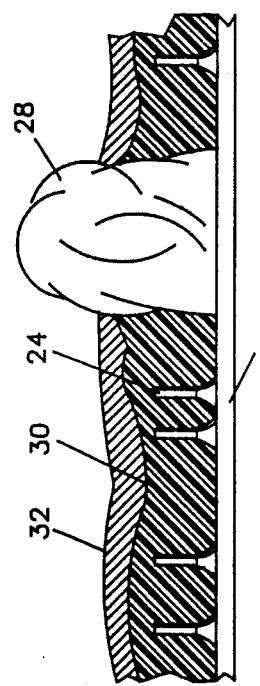
FIG. 9 a partially cutaway drawing of the electronics module of FIG. 5 at a yet further intermediate stage in the process of FIG. 6 of the present invention.

Thereafter, as depicted in FIG. 9, a substantially continuous, electrically conductive metallic coating 32 is applied over the electrically insulating coating material 30 at conductive coating station 46. The electrically conductive metallic coating 32 may be applied by any suitable conventional technique such as by spraying or plating. Electrically conductive metallic coating 32 must have an electrical resistivity adequate for the required level of suppression of the RFI/EMI emissions from the particular module. The required parameters to achieve that result are easily determined by those skilled in the art. The conductive coating 32 optionally may be connected to the product's ground, i.e. as shown in FIG. 14.

Figure 14:
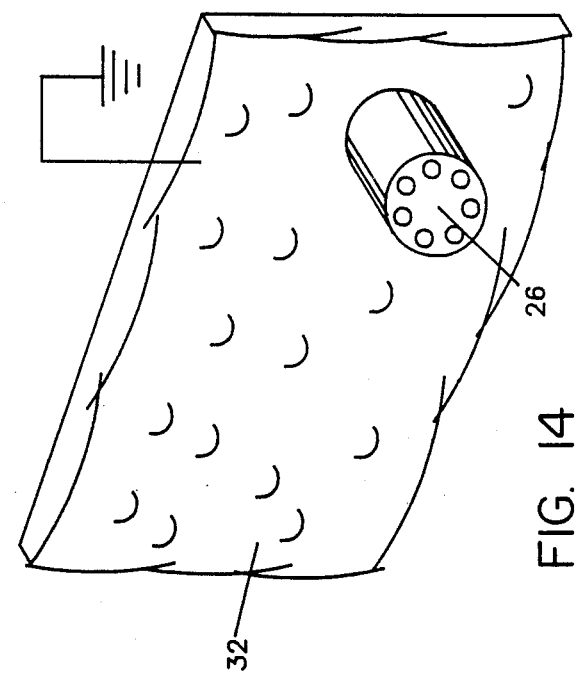

The final step of the above-described method according to this invention comprises the removal of masking elements from the module 20 at mask removal station 48, whereby to yield a RFI/EMI shielded module as depicted in FIG. 14.

Figure 10:
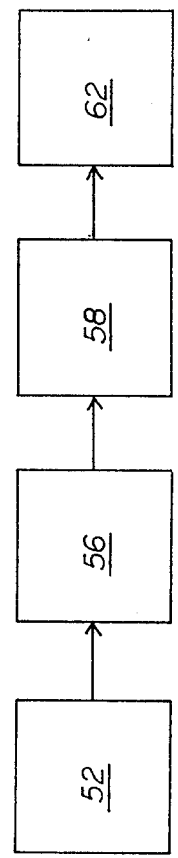
FIG. 10 is a side elevational view, diagrammatically illustrating an alternative process for producing an EMI/RFI shielded electronics module in accordance with an alternative embodiment of the invention.

An alternative method for forming an RFI/EMI shielded module in accordance with the present invention is shown in FIG. 10. The process of FIG. 10 is similar to that as shown in FIG. 6, in which, however, the electrically insulating coating material comprises a preformed sheet material 50. The sheet 50, which may comprise a thin, e.g. 0.005 to 0.060 inch thick sheet of thermoplastic material such as VPI's Acrylic Barrex #210, VPI Series 4000, is preshaped in a forming station 52 to conform with the particular module to be shielded. Sheet 50 may be vacuum molded, for example, using a simple female cavity mold for the module to be shielded, using vacuum molding techniques as are well known in the art. The resulting molded sheet 54 (see FIG. 11) is then removed from the mold and passed to a cutting station 56 where it is die cut or punched using conventional precision stamping techniques or the like to remove selected areas of the sheet, i.e. to accommodate connectors, mounting holes and electrically insulated portions of cases of high heat-dissipation electronic devices of the module to be shielded (see FIG. 12). The molded, punched sheet is then passed to conductive coating station 58 where an electrically conductive metallic coating 60 is applied over the molded punched sheet 50, for example, by spraying or plating as before (see FIG. 13). The resulting coated molded sheet product is then affixed in place on the module to be shielded in covering station 62 whereby to form a RFI/EMI shielded electronic module in accordance with the present invention.

Various changes may be made in the above process and device without departing from the scope of the invention herein described. For example, sheet 50 may be pre-punched, and then vacuum molded directly onto the module to be shielded using conventional vacuum-pack molding techniques. The coated module may then be selectively masked, and conductive coating applied as above described. Still other changes will be made without departing from the spirit and scope of the invention.

Wherefore, having described our the method of the present invention, what is claimed is:

1. The method of RFI/EMI shielding an individual module of an electronic assembly comprising the steps of:
    (a) applying a substantially continuous, conformal, electrically insulating material to predetermined surfaces of the module to a thickness to reliably cover protruding features of electronic components carried on the module;
    (b) applying a substantially continuous, electrically conductive coating over the insulating material;
    (c) masking predetermined surface of the module prior to applying said electrically insulating material; and,
    (d) removing said masking following application of said electrically conductive coating.

2. The method of claim 1, wherein said electrically insulating material is applied to a thickness of approximately 0.005 inch to 0.060 inch.

3. The method of claim 1, wherein said electrically insulating material is applied to a thickness of approximately 0.010 inch to 0.020 inch.

4. The method of claim 1, wherein said electrically insulating material comprises a polymer-resin material of sufficiently high viscosity such that small spaces are bridged by the cured material and respective fillets/meniscuses are formed in corners by the material.

5. The method of claim 1, wherein electrically insulating material is filled with an electrically insulating, thermally conductive particulate solid.

6. The method of claim 5, wherein said particulate solid comprises a powdered metal oxide.

7. The method of claim 6, wherein said powdered metal oxide comprises aluminum oxide.

8. The method of claim 1, and additionally comprising the step of:
    electrically connecting the electrically conductive coating to ground, and electrically filtering entry and exit conductors.

9. The method of claim 1, wherein said electrically insulating material is applied as a liquid, and is set or cured in place.

10. The method of claim 1, wherein said electrically insulating material is applied as a film material.

11. The method of claim 10, wherein said electrically insulating film material is applied by vacuum molding in place on the module.

12. The method of claim 10, wherein said electrically insulating film material is applied to the module preshaped.

13. The method according to claim 1, wherein said electrically conductive material is applied by plating.

14. The method according to claim 1, wherein said electrically conductive material is applied by spraying.

15. An RFI/EMI shielded electronic assembly comprising an electronic module coated on substantially all exposed surface of the module by an electrically insulating material of a thickness sufficient to reliably cover protruding features of electrical components carried on the module; a substantially continuous electrically conductive coating over the electrically insulating coat, and a mask overlying a predetermined surface of said module underneath said insulating material, said mask being removable, along with its overlying insulating material, to expose said predetermined surface.

16. An electronic assembly according to claim 15, wherein said electrically insulating material has a thickness of approximately 0.005 inch to 0.060 inch.

17. An electronic assembly according to claim 16, wherein said electrically insulating material has a thickness of approximately 0.010 inch to 0.020 inch.

18. An electronic assembly according to claim 15, wherein said electrically insulating material is filled with an electrically insulating, thermally-conductive particulate solid.

19. An electronic assembly according to claim 18, wherein said electrically insulating, thermally-conductive particulate solid comprises a powdered metal oxide.

20. An electronic assembly according to claim 19, wherein said powdered metal oxide comprises aluminum oxide.

21. An RFI/EMI shielded electronic assembly comprising an electronic module coated at least in part by an electrically insulating material of a thickness sufficient to reliably cover protruding features of electrical components carried on the module, said insulating material being filled with an electrically insulating, thermally-conductive particulate solid; a substantially continuous electrically conductive coating over the electrically insulating coating, and a mask overlying a predetermined surface of said module underneath said insulating material, said mask being removably, along with its overlying insulating material, to expose said predetermined surface.

22. An electronic assembly according to claim 21, wherein said electrically insulating, thermally-conductive particulate solid comprises a powdered metal oxide.

23. An electronic assembly according to claim 21, wherein said powdered metal oxide comprises aluminum oxide.

24. An electronic assembly according to claim 21, wherein said electrically insulating material has a thickness of approximately 0.005 inch to 0.060 inch.

25. An electronic assembly according to claim 24, wherein said electrically insulating material has a thickness of approximately 0.010 inch to 0.020 inch.

* * * * *